(12) United States Patent
Anderson et al.

(10) Patent No.: US 11,700,028 B2
(45) Date of Patent: Jul. 11, 2023

(54) TRANSMIT RECEIVE RADIO FREQUENCY SWITCH

(71) Applicant: DSP Group Ltd., Herzliya (IL)

(72) Inventors: Sergey Anderson, Netanya (IL); Nadav Snir, Tel Aviv (IL)

(73) Assignee: DSP Group Ltd., Herzliya (IL)

( * ) Notice: Subject to any disclaimer, the term of this patent is extended or adjusted under 35 U.S.C. 154(b) by 0 days.

(21) Appl. No.: 17/140,301

(22) Filed: Jan. 4, 2021

(65) Prior Publication Data

US 2021/0266032 A1 Aug. 26, 2021

Related U.S. Application Data

(60) Provisional application No. 62/981,562, filed on Feb. 26, 2020.

(51) Int. Cl.
*H03K 17/693* (2006.01)
*H04B 1/44* (2006.01)

(52) U.S. Cl.
CPC ............ *H04B 1/44* (2013.01); *H03K 17/693* (2013.01)

(58) Field of Classification Search
None
See application file for complete search history.

(56) References Cited

U.S. PATENT DOCUMENTS

| | | | | |
|---|---|---|---|---|
| 7,843,280 B2* | 11/2010 | Ahn | ................ | H04B 1/48 333/103 |
| 8,076,996 B2* | 12/2011 | Lee | ................ | H03H 11/32 333/25 |
| 8,244,199 B2* | 8/2012 | Goto | ................ | H01L 21/823425 455/26.1 |
| 8,395,435 B2* | 3/2013 | Cassia | ................ | H03K 17/102 327/436 |
| 8,514,008 B2* | 8/2013 | Yan | ................ | H03K 17/161 327/427 |
| 8,729,948 B2* | 5/2014 | Sugiura | ................ | H01P 1/15 455/333 |
| 9,148,194 B2* | 9/2015 | Madan | ................ | H01L 21/84 |
| 9,190,994 B2* | 11/2015 | Hurwitz | ................ | H03K 17/161 |
| 9,197,280 B1* | 11/2015 | Yoo | ................ | H04B 1/48 |
| 9,385,703 B2* | 7/2016 | Kim | ................ | H03K 17/145 |
| 9,397,651 B2* | 7/2016 | Brunsilius | ................ | H01L 27/0921 |
| 2006/0022526 A1* | 2/2006 | Cartalade | ................ | H03K 17/693 307/112 |
| 2006/0119451 A1* | 6/2006 | Chen | ................ | H01L 27/088 257/E27.06 |
| 2008/0290928 A1* | 11/2008 | Kawakyu | ................ | H03K 17/005 327/429 |

(Continued)

*Primary Examiner* — Thomas J. Hiltunen
(74) *Attorney, Agent, or Firm* — Leydig, Voit & Mayer, Ltd.

(57) ABSTRACT

A TX/RX RF switch that may include a reception path; and a transmission path that has an antenna port, a transmission input port, and transmission transistors. The transmission transistors have source-bulk connections. The reception path has an antenna port, a reception output port, and reception transistors. The reception path includes a first reception transistor that is closest to the antenna port, out of the reception transistors, and has a source-bulk connection, and at least one other reception transistor that has a bulk-to-ground connection. The reception transistors and the transmission transistors are CMOS transistors.

19 Claims, 10 Drawing Sheets

(56) References Cited

U.S. PATENT DOCUMENTS

2011/0221519 A1* 9/2011 Katoh ................. H04B 1/0057
                                                                        327/558
2013/0278323 A1* 10/2013 Bakalski ................ H02M 3/07
                                                                        327/382

* cited by examiner

TRANSMIT RECEIVE RADIO FREQUENCY SWITCH

CROSS REFERENCE

This application claims priority from U.S. provisional patent 62/981,562 filing date Jan. 26, 2020 which is incorporated herein by reference.

BACKGROUND

Wireless mobile transceivers (Bluetooth, DECT, GSM, 3G, LTE, WiMax, Wi-Fi 802.11 n/ac, ULE 802.11ah, IoT etc.) include a low noise amplifier (LNA) in the reception (Rx) path, a power amplifier (PA) in the transmission (Tx) path and a transmit receive radio frequency switch to connect the LNA and the PA to an antenna port. Obviously, the transmit receive radio frequency switch should have low insertion loss for both transmission mode and reception mode, should have an enhanced linearity for the transmission mode and have a sufficient isolation between a transmission port to a reception port in order to prevent voltage stress on input transistors in the LNA, while PA is in an operating mode.

The most popular complementary metal-oxide-semiconductor (CMOS) single port double throw (SPDT) transmit receive radio frequency switches include a sequence of series and shunt NMOS connected transistors in order to improve the isolation between the transmission port to the reception port. However, the shunt transistors create additional losses in the reception path and the transmission paths of the transmit receive radio frequency switch, and create additional non-linear distortions and therefore reduce linearity of the transmit receive radio frequency switch.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

DETAILED DESCRIPTION OF THE DRAWINGS

Figure 1:
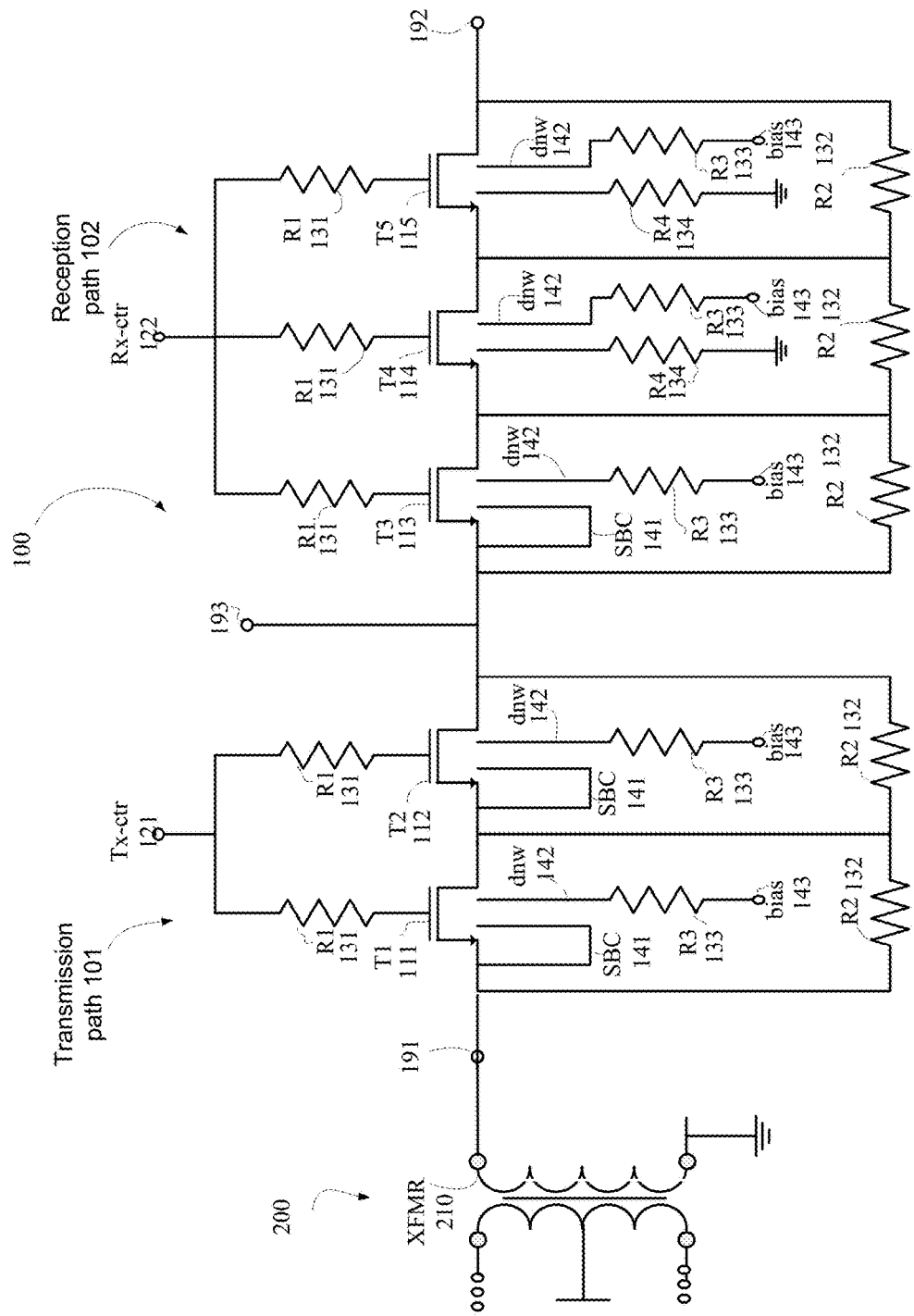
FIG. 1 illustrates an example of a transmit receive radio frequency switch.

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

Any reference in the specification to a system should be applied mutatis mutandis to a method that can be executed by the system.

Because the illustrated at least one embodiment of the present invention may for the most part, be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

Any reference in the specification to a method should be applied mutatis mutandis to a system capable of executing the method.

The term "high-impedance" in relation to various resistors (such as a first resistor R1, a second resistor R2, and a third resistors R3) may range, for example, between 10KΩ to 100KΩ. The value of each resistor may be determined to guarantee a robust operation of the transistors of the transmit receive radio frequency switch in cut-off and triode regions, reduce the insertion losses of the transistors and improve their linearity in both transmission mode and reception mode of the transmit receive radio frequency switch.

There is provided a transmit receive radio frequency switch that may be a CMOS single pole double throw (SPDT) transmit receive radio frequency switch.

There is provided a transmit receive radio frequency switch that may include a reception path (with serially connected reception transistors) and transmission path (with serially connected transmission transistors).

There are two divergent approaches to design a transmit receive radio frequency switch using standard CMOS bulk technologies.

The first approach is to connect the bulk of a transistor (of the transmit receive radio frequency switch) to a floating point or through a high-impedance resistor to the ground (using the resistive body-floating technique) in order to avoid leakage of the radio-frequency signal to the substrate of the transistor.

The second approach is to connect a bulk of an NMOS transistor (of the transmit receive radio frequency switch) to its source in order to reduce body effect in the transistor, which is defined as the change in bulk voltage with respect to source voltage, and therefore to reduce the threshold voltage of the transistor.

The second approach allows to also exclude a PN junction effect from the transistor, i.e. eliminate PN diode between source and a p-well of the transistor.

In order to provide a balance between these approaches, the suggested transmit receive radio frequency switch includes one or more transistors that have a bulk-source connection, and one or more other transistors that have a bulk-ground connection. The bulk-to-ground connection may be obtained using high-impedance resistors (for example—by implementing the resistive body-floating technique).

There may be any number (one or more) of reception transistors and any number of transmission transistors.

There may be any relationship between the number of reception transistors and the number of transmission transistors.

The design of the transmit receive radio frequency switch may be based on various PN junction formation controls of a series transistor connected to the virtual ground. In one example all the transmission transistors have source-bulk connection, with the aim of reducing the PN junction effect on the linearity of the transistors. For the reception path, the first reception transistor (the reception transistor that is closest to an antenna port), and the transmission transistors may have the same configuration (i.e. source-bulk connection) in order to retain the linearity of the transmitter. One or more other reception transistors may have a bulk-to-ground connection through a high-impedance resistor in order to prevent RF leakage to the CMOS substrate of the transmit receive radio frequency switch.

The transmit receive radio frequency switch may exhibit at least one of the following:
 a. Have a virtual ground for robust operation in cut-off and triode regions of the transistors (transmission transistors in triode region while reception transistors in cut-off and vice versa) and it is formed by connection of high-impedance resistors R2 between drain and source at every reception transistor and at every transmission transistor.
 b. All deep-n-well "dnw" pins of the reception and transmission transistors are connected to a common biasing voltage through high-impedance resistors R3. For example—the dnw-biasing voltage (bias coupled to the dnw) may be equal or even higher the transmission control voltage and the reception control voltage.
 c. All gates of the transmission transistors are connected to transmission control voltage through the high-impedance resistors R1 to eliminate RF leakage of the transmission transistors to transmission path control devices due to parasitic gate-source and gate-drain capacitors. The same may be applied to the reception transistors—all gates of the reception transistors are connected to reception control voltage through the high-impedance resistors R1 to eliminate RF leakage of the reception transistors to reception path control devices due to parasitic gate-source and gate-drain capacitors
 d. The transmission transistors have bulk-source connection configuration, i.e. their "bulk" pins are connected directly to their source pins.
 e. Reception transistors other than the first reception transistor may have bulk-to-ground connection through the high-impedance resistors R4 for preventing RF leakage from the bulk of the transistors to the substrate.
 f. A secondary coil of a power amplifier output transformer is connected to a common substrate ground.

Non-limiting example of resistances of R1 are 30 KΩ, of R2 are 12 KΩ, of R3 are 18 KΩ and of R4 are 18 KΩ.

Examples of the effect obtained when using CMOS transmit receive radio frequency switch with various PN junction formation controls of a series transistor connected to the virtual ground is illustrated in FIGS. 3-9.

Figure 3:
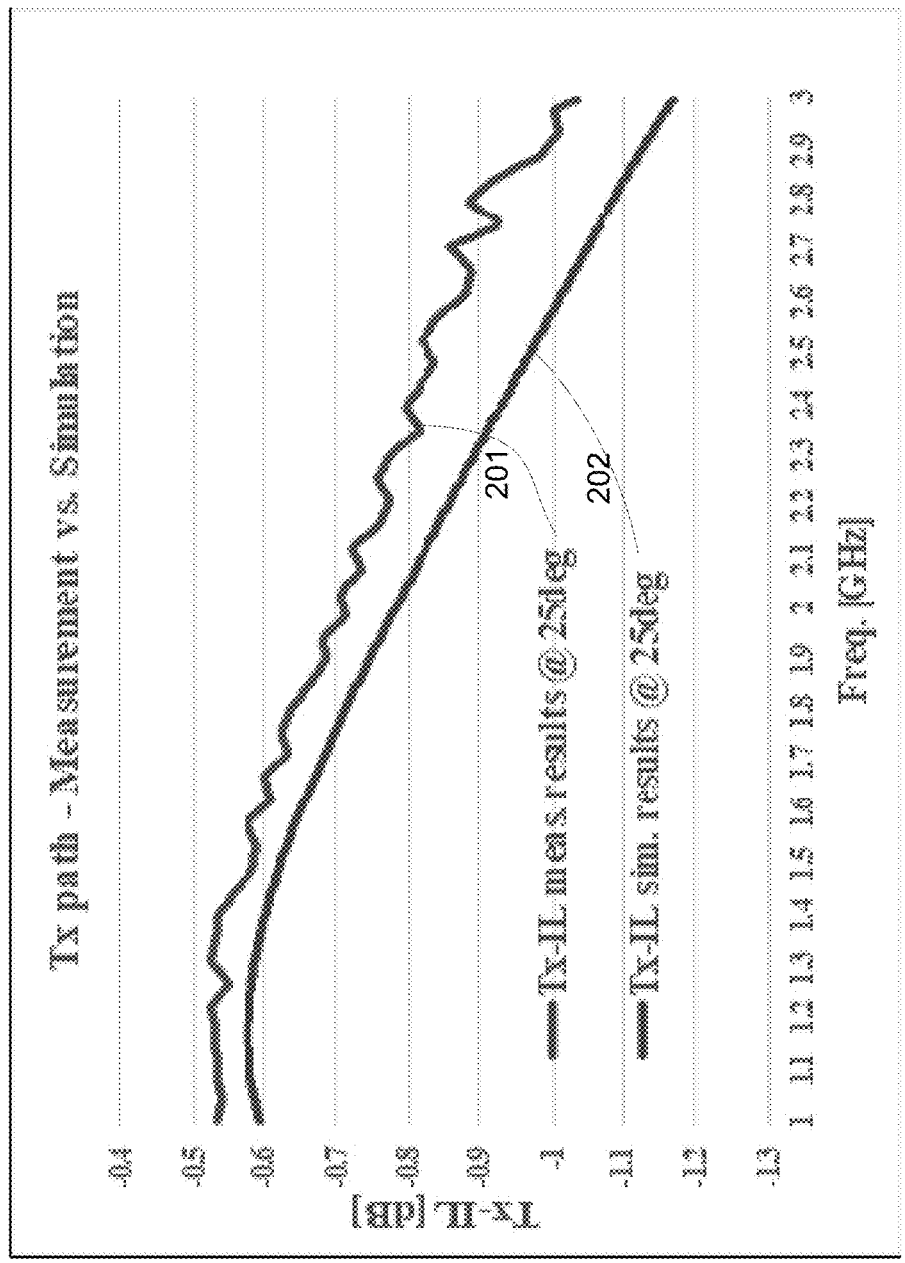
FIGS. 3-9 are example of simulations and/or measurements.

FIG. 3 illustrates an example of a simulated (curve 202) and a measured (curve 201) insertion loss at transmission mode (y-axis) per frequency (x-axis).

Figure 4:
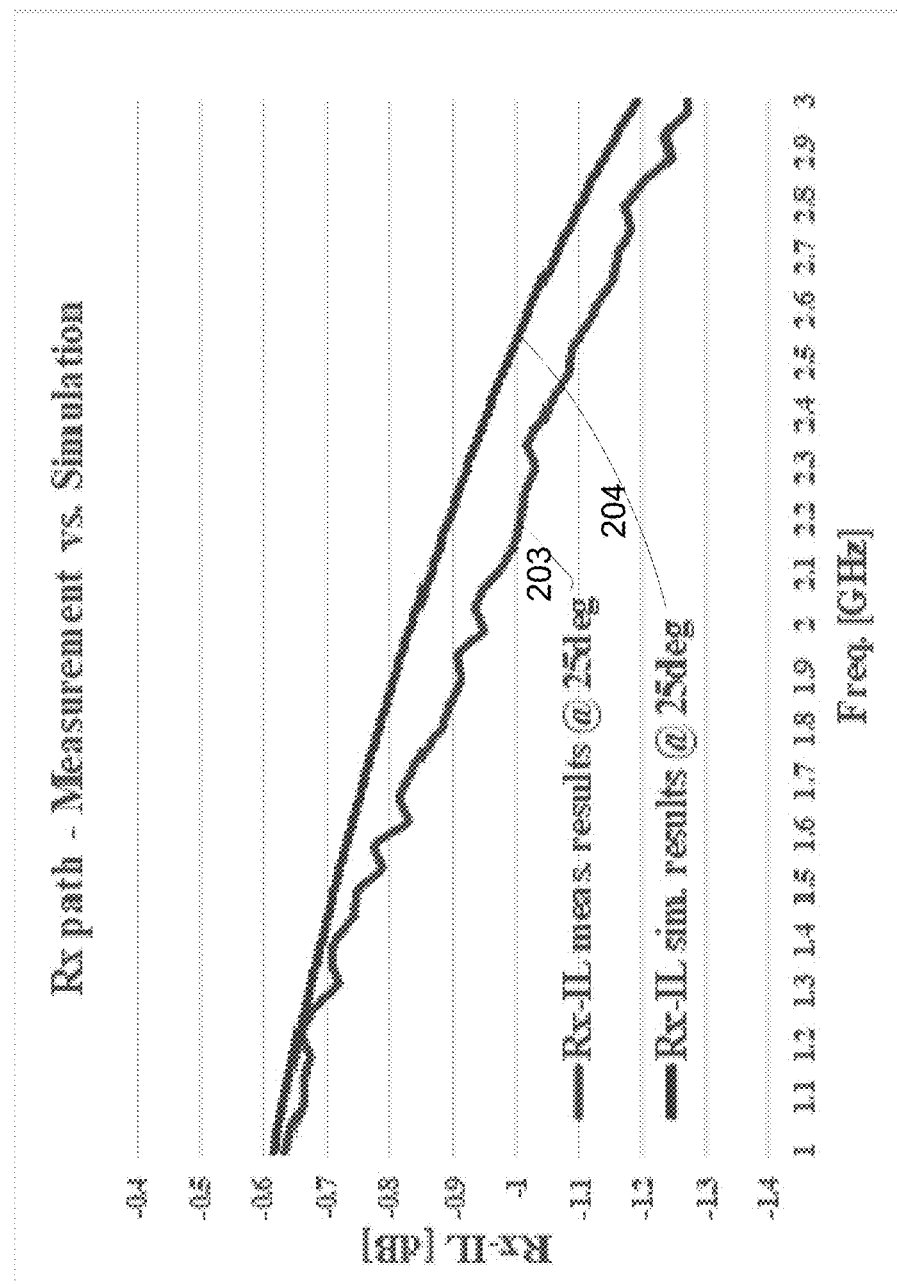

FIG. 4 illustrates an example of a simulated (curve 204) and a measured (curve 203) insertion loss at reception mode (y-axis) per frequency (x-axis).

Figure 5:
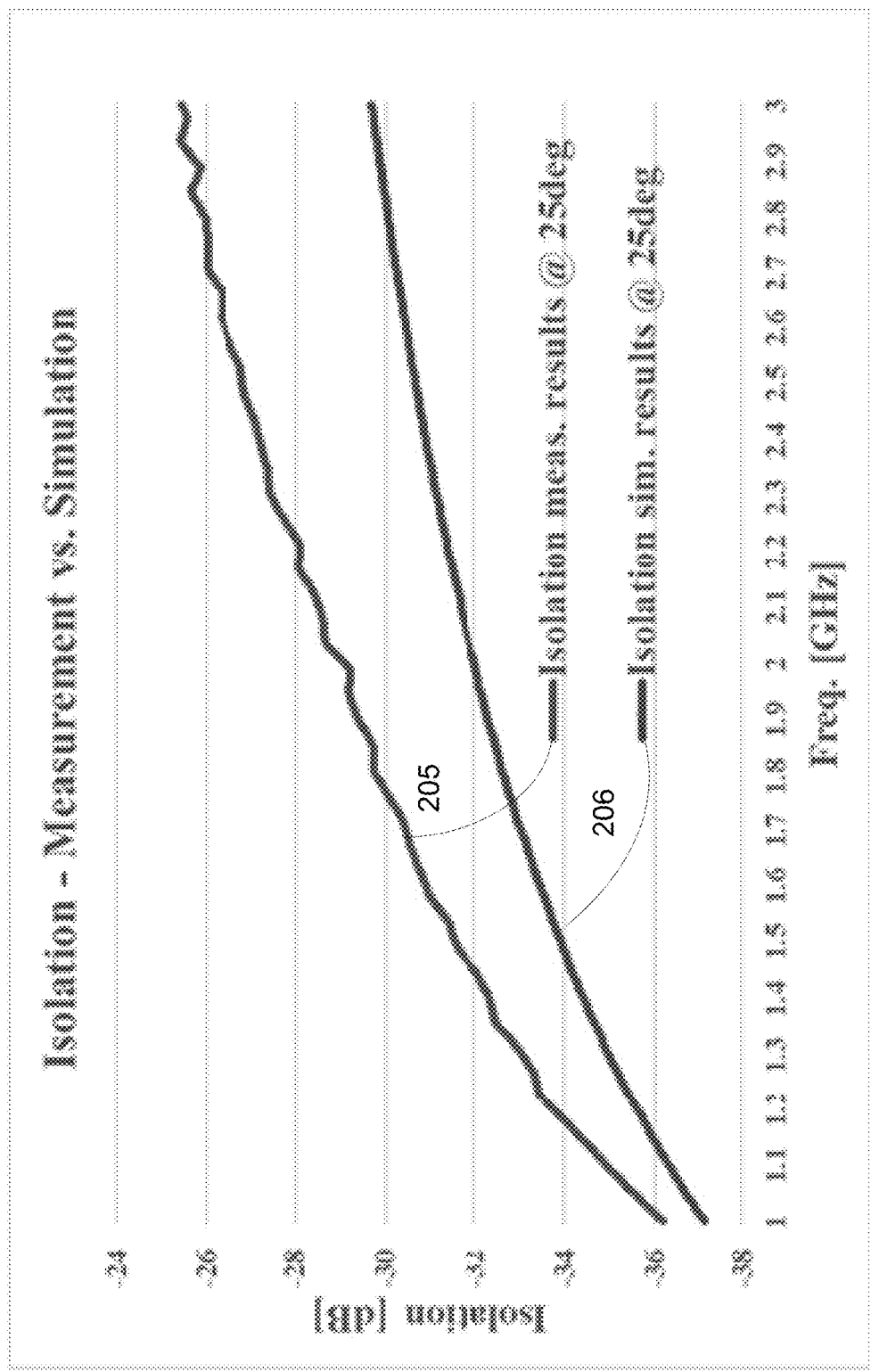

FIG. 5 illustrates an example of a simulated (curve 206) and a measured (curve 205) transmission path to reception path isolation (y-axis) per frequency (x-axis).

Figure 6:
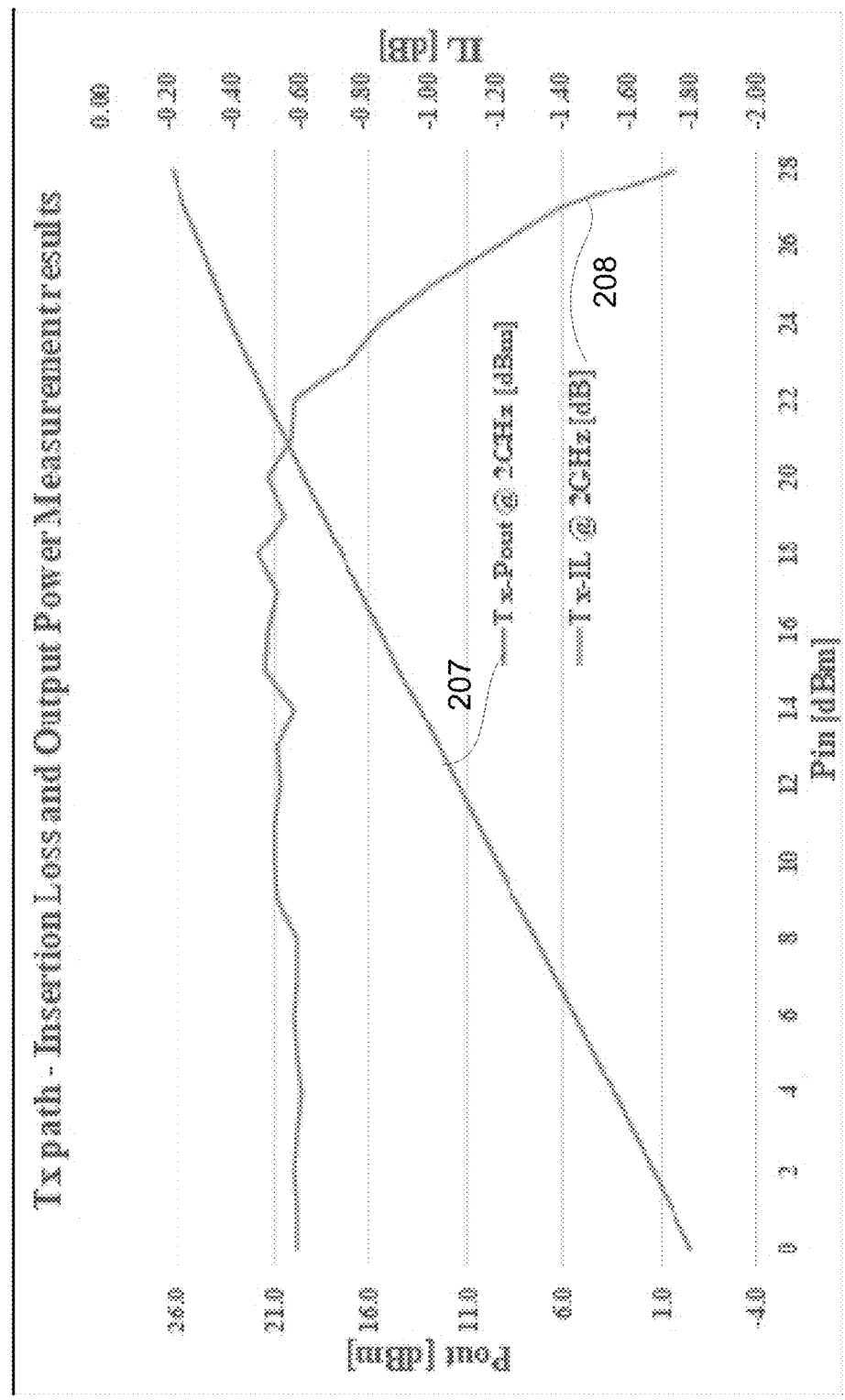

FIG. 6 illustrates an example of insertion loss (curve 208) at transmission mode versus input power (x-axis) and also an example of output power (curve 207) versus input power (x-axis). The right y-axis illustrates values of the insertion loss and the left y-axis illustrates values of the output power.

Figure 7:
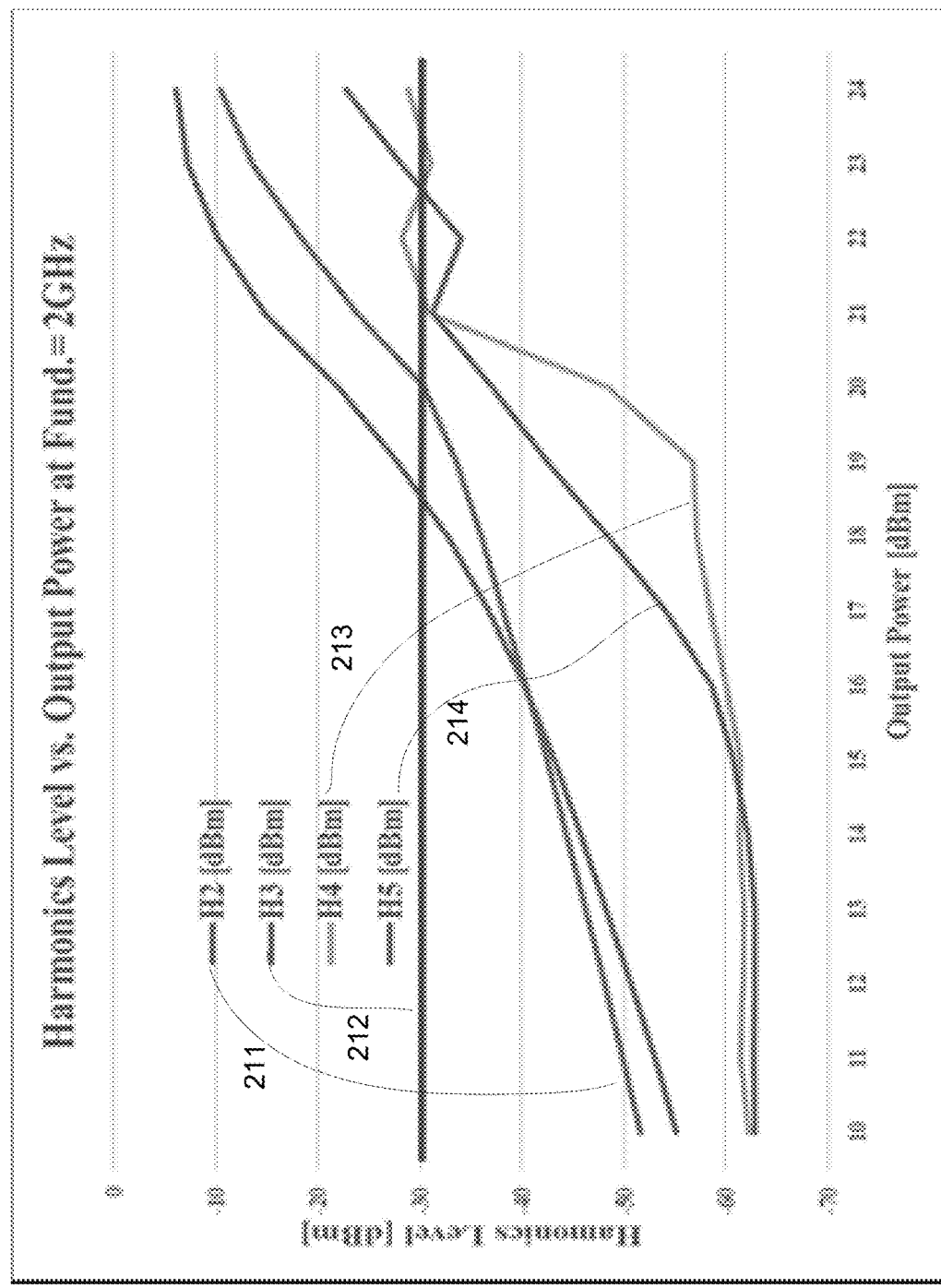

FIG. 7 illustrates the lover (y-axis) of a second harmonic H2 (curve 211), a third harmonic H3 (curve 212), a fourth harmonic H4 (curve 213), and a fifth harmonic H5 (curve 214) versus output power (x-axis) at a fundamental frequency of 2 Ghz.

Figure 8:
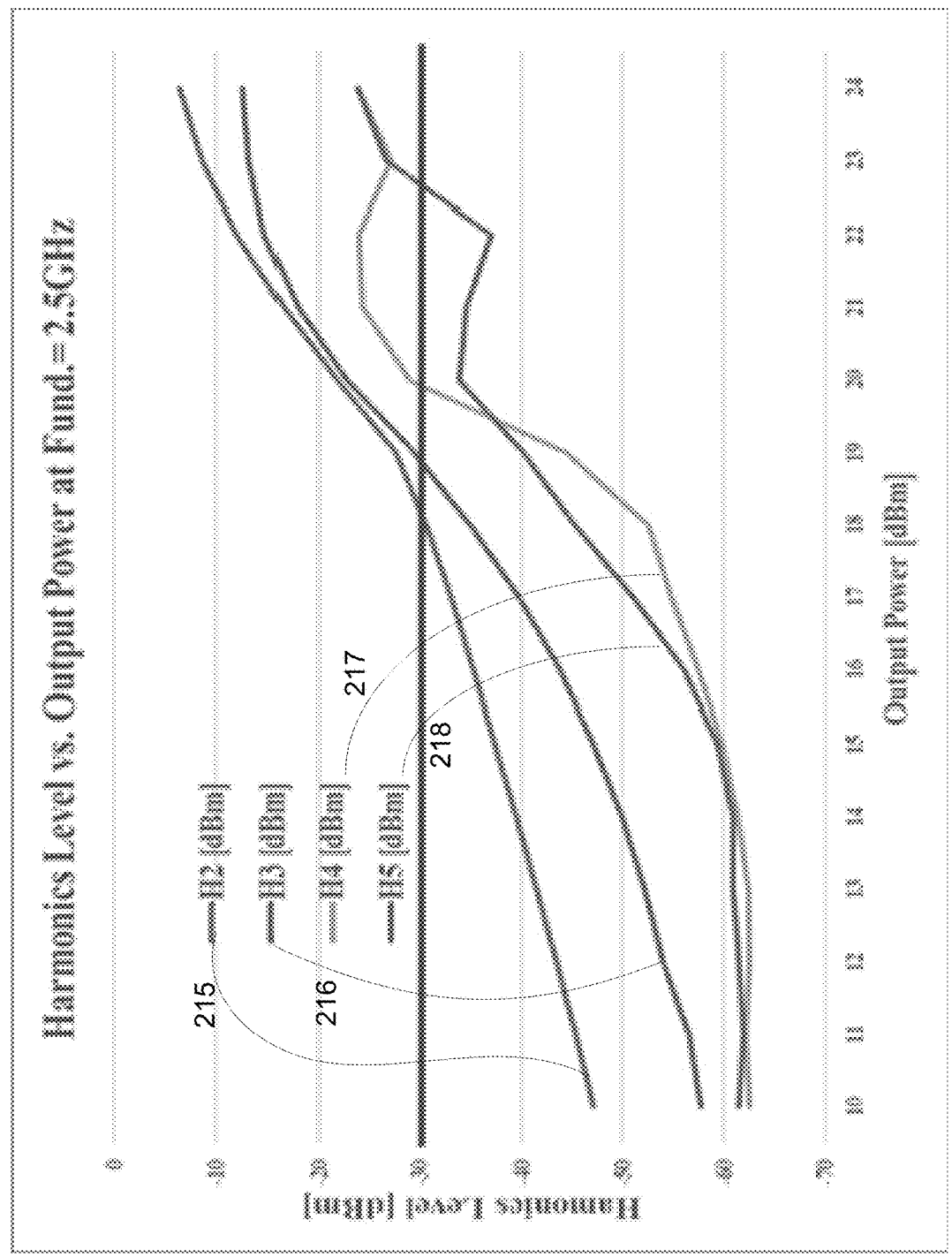
Figure 9:
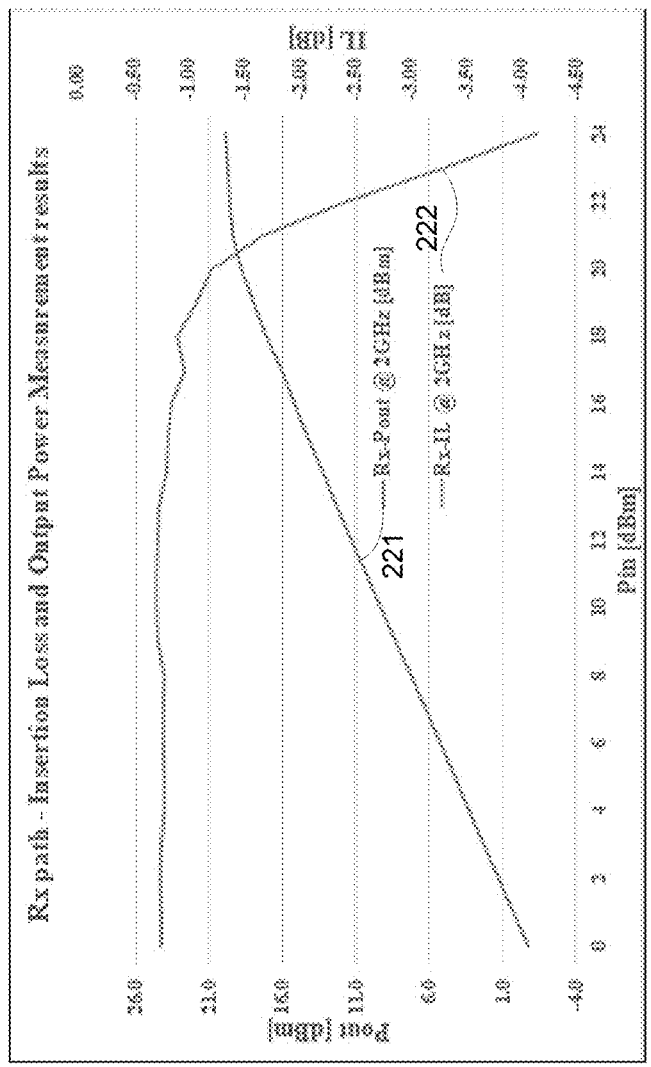

FIG. 8 illustrates the lover (y-axis) of a second harmonic H2 (curve 215), a third harmonic H3 (curve 216), a fourth harmonic H4 (curve 217), and a fifth harmonic H5 (curve 218) versus output power (x-axis) at a fundamental frequency of 2.5 Ghz.

In various tests—the following results were obtained:
 a. The insertion loss is about 0.7 dB in transmission mode (FIG. 3) and about 0.92 dB in reception mode (FIG. 4) for DECT.
 b. The insertion loss is about 0.85 dB in transmission mode (FIG. 3) and about 1.1 dB in reception mode (FIG. 4) for BT.
 c. Transmission path to reception path isolation below −25 dB. See, measured and simulated isolation results of curve 205 and curve 206 of FIG. 5.
 d. IP1 dB Tx ~27 dBm (FIG. 6) and IP1 dB Rx ~18 dBm (FIG. 9) at 2 GHz.
 e. The comprehensive performance obtained in both transmit and receive modes is the highest reported to date in a standard deep sub-micron CMOS process FIG. 1 illustrates a transmit receive radio frequency switch 100 and a load 200. The load may be a power amplifier output transformer 210 having a secondary coil that may couple the series of second resistors to the ground.

The transmit receive radio frequency switch 100 is a CMOS transmit receive radio frequency switch in the sense that its transistors (for example T1-T5) are CMOS transistors.

The transmit receive radio frequency switch 100 includes a reception path 102 and a transmission path 101.

The transmission path 101 includes an antenna port 193, a transmission input port 191, and transmission transistors such as first transmission transistor T1 111 and second transmission transistor T2 112. The number of transmission transistors of the transmission path 101 may differ than two—for example may exceed two.

Each of the first and second transmission transistors has a source-bulk connection denoted SBC 141 in FIG. 1.

The reception path includes the antenna port 193, a reception output port 192, and reception transistors such as first reception transistor T3 113, second reception transistor T4 114 and third reception transistor T5 115. The number of reception transistors of the reception path 102 may differ than three—for example may exceed three.

The first reception transistor T3 113 is closest to the antenna port 193, out of the reception transistors. The first reception transistor T3 113 may be electrically coupled between the antenna port 193 to the second reception transistor T4 114. The third reception transistor T5 115 is connected between the second reception transistor T4 114 and the reception output port 192.

Each one of the first reception transistor T3 113, the first transmission transistor T1 111 and the second transmission transistor T2 112 has a source-bulk connection (SBC) 141.

At least one other reception transistor (for example second reception transistor T4 114 and third reception transistor T5 115) has a bulk-to-ground connection (via fourth resistors R4 134).

FIG. 1 illustrates that all reception transistors other than the first reception transistor have the bulk-to-ground connection. It should be noted that more than one reception transistor may have a bulk-to-ground connection.

FIG. 1 illustrates that each reception transistor and each transmission transistor is virtually grounded. The virtual ground may be provided by second resistors R2 132 and the output load. Each second resistor is connected between a source and a drain of each transistor out of T1-T5. The output load is electrically couples the second resistors to the ground.

FIG. 1 illustrates that each reception transistor and each transmission transistor includes a deep-n-well pin (dnw 142) that is connected to a biasing voltage (bias 143) through a third resistor of high impedance FIG. 1 illustrates that a gate of each reception transistor is connected to a reception control voltage ("Rx-ctr" 122 of FIG. 1) through a first resistor (R1 131) of high impedance.

FIG. 1 illustrates that a gate of each transmission transistor is connected to a transmission control voltage ("Tx-ctr" 121 of FIG. 1) through a first resistor (R1 131) of high impedance.

The reception control voltage and the transmission control voltage control the operation of the reception transistors and the transmission transistors, respectively.

FIG. 1 illustrates that each transmission transistor is also coupled to a biasing voltage (bias 143). The biasing voltage may equals the transmission control voltage or exceeds the transmission control voltage.

Figure 2:
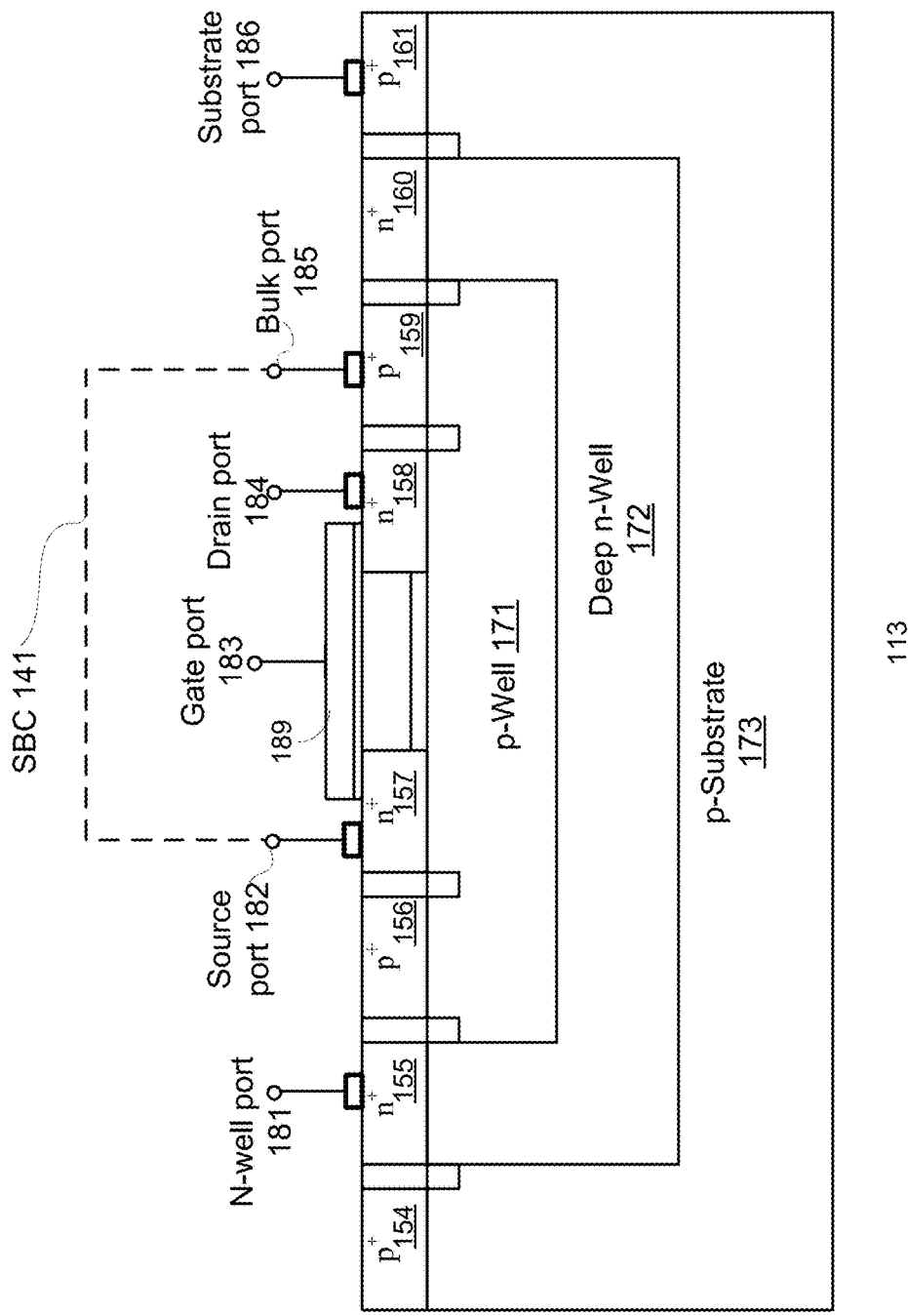
FIG. 2 illustrates a cross section of a transistor of the transmit receive radio frequency switch.

FIG. 2 illustrates an example of the first reception transistor T3 113.

The first reception transistor includes p-well 171, deep n-well 172, a p-substrate 173, p$^+$ regions 154, 156, 159 and 161, n$^+$ regions 155, 157, 158 and 160, gate 189 and intermediate regions—such as isolating regions between the p$^+$ and n$^+$ regions and various ports.

The p$^+$ regions and n$^+$ regions are arranged in an alternating region—starting from p$^+$ region 154 and ending at p$^+$ 161. A N-well port 181 is connected to n$^+$ region 155.

A source port 182 is connected to n$^+$ region 157. A gate port 183 is connected to gate 189. A drain port 184 is connected to n$^+$ region 158. A bulk port 185 is connected to p$^+$ region 159. A substrate port 186 is connected to p-substrate 161.

The p-well 171 interfaces p$^+$ regions 156 and 159, and n$^+$ regions 155, 157, 159 and 161.

Deep n-well 152 surrounds p-well 171 and interfaces with n$^+$ regions 155 and 160.

The p-substrate 173 surrounds deep n-well 152 and interfaces with p$^+$ regions 154 and 161.

The source-bulk connection (SBC) 141 electrically couples (may even short circuit) the source and bulk—thereby preventing a formation of a diode at the PN junction between n$^+$ region 157 and the p-well 171.

Any of the figures may or may not be in scale.

Figure 10:
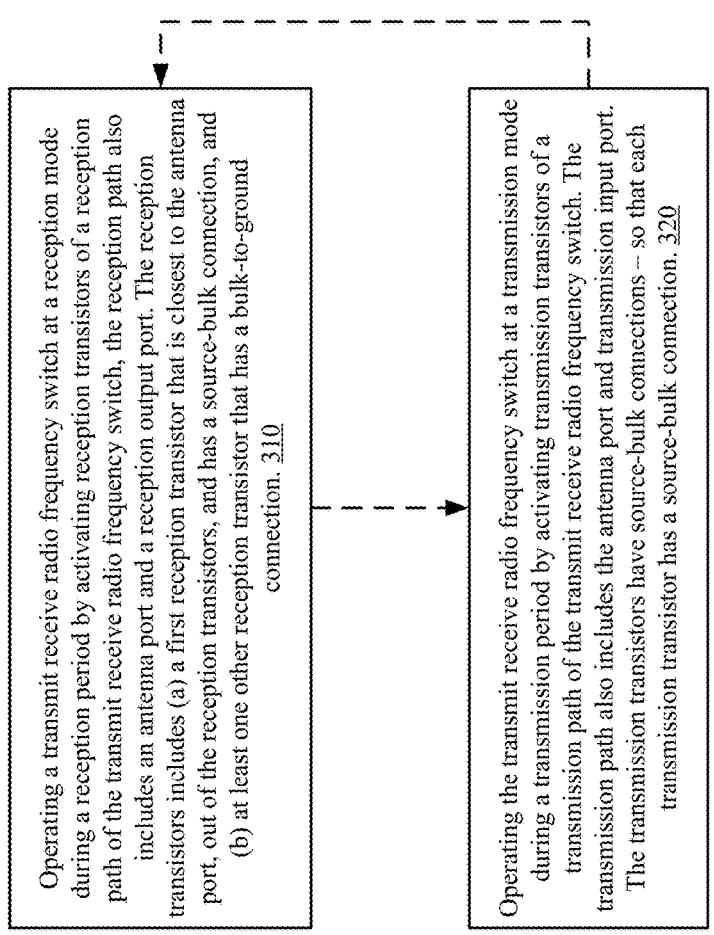
FIG. 10 illustrates an example of a method.

FIG. 10 is an example of method 300.

Method 300 may include steps 310 and 320.

Step 310 may include operating the transmit receive radio frequency switch at a reception mode during a reception period by activating reception transistors of a reception path of the transmit receive radio frequency switch, the reception path also includes an antenna port and a reception output port. The reception transistors include (a) a first reception transistor that is closest to the antenna port, out of the reception transistors, and has a source-bulk connection, and (b) at least one other reception transistor that has a bulk-to-ground connection.

Step 310 may include receiving a radio frequency signal from the antenna (via the antenna port), passing the radio frequency signal through the reception transistors and outputting a radio frequency signal from the reception output port.

Step 320 may include operating the transmit receive radio frequency switch at a transmission mode during a transmission period by activating transmission transistors of a transmission path of the transmit receive radio frequency switch. The transmission path also includes the antenna port and transmission input port. The transmission transistors have source-bulk connections—so that each transmission transistor has a source-bulk connection.

The reception transistors and the transmission transistors are COMS transistors. Any may be NMOS transistors.

Step 320 may include receiving a radio frequency signal from a transmission input, passing the radio frequency signal through the transmission transistors and outputting a radio frequency signal from the antenna port.

Method 300 may also include a step of jumping (see dashed arrows) between steps 310 and 320—therefore changing the operational mode of the transmit receive radio frequency switch.

Any reference to any of the terms "comprise", "comprises", "comprising" "including", "may include" and "includes" may be applied mutatis mutandis to any of the terms "consists", "consisting", "and consisting essentially of".

In the foregoing specification, the invention has been described with reference to specific examples of embodiments of the invention. It will, however, be evident that various modifications and changes may be made therein without departing from the broader spirit and scope of the invention as set forth in the appended claims.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Those skilled in the art will recognize that the boundaries between elements are merely illustrative and that alternative embodiments may merge elements or impose an alternate decomposition of functionality upon various elements. Thus, it is to be understood that the architectures depicted herein are merely exemplary, and that in fact many other architectures can be implemented which achieve the same functionality.

Any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations are merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit. Alternatively, the examples may be implemented as any number of separate integrated circuit or separate integrated circuit interconnected with each other in a suitable manner. However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

What is claimed is:

1. A transmit receive radio frequency switch, comprising:
a reception path; and
a transmission path;
wherein the transmission path comprises an antenna port, a transmission input port, and a plurality of transmission transistors,
wherein each transmission transistor of the plurality of the transmission transistors has a source-bulk connection,
wherein the reception path comprises the antenna port, a reception output port, and a plurality of reception transistors,
wherein the plurality of reception transistors comprises:
(a) a first reception transistor having a source-bulk connection, and (b) at least two other reception transistors, wherein all reception transistors other than the first reception transistor have a bulk-to-ground connection when the first reception transistor has the source-bulk connection, wherein the first reception transistor is closer to the antenna port than the at least two other reception transistors, and
wherein the plurality of reception transistors and the plurality of transmission transistors are complementary metal-oxide-semiconductor transistors, and wherein a configuration of the plurality of reception transistors is different than a configuration of the plurality of transmission transistors.

2. The transmit receive radio frequency switch according to claim 1, wherein each reception transistor and each transmission transistor is virtually grounded.

3. The transmit receive radio frequency switch according to claim 1, further comprising second resistors, wherein at least one of the second resistors is coupled between a drain and source of each transistor of the reception transistors and the transmission transistors.

4. The transmit receive radio frequency switch according to claim 1, wherein each reception transistor and each transmission transistor comprises a deep-n-well pin that is coupled to a biasing voltage through a third resistor.

5. The transmit receive radio frequency switch according to claim 1, wherein a gate of each of the reception transistors is coupled to a reception control voltage through a first resistor.

6. The transmit receive radio frequency switch according to claim 1, wherein a gate of each of the transmission transistors is coupled to a transmission control voltage through a first resistor.

7. The transmit receive radio frequency switch according to claim 6, wherein each of the transmission transistors is also coupled to a biasing voltage, wherein the biasing voltage equals the transmission control voltage or exceeds the transmission control voltage.

8. The transmit receive radio frequency switch according to claim 1, wherein all transmission transistors have the source-bulk connections.

9. The transmit receive radio frequency switch according to claim 1, wherein the transmission path consists of the antenna port, the transmission input port, and the transmission transistors; wherein all transmission transistors are serially coupled to each other, and all reception transistors are serially coupled to each other.

10. The transmit receive radio frequency switch according to claim 1, the first reception transistor maintains the source-bulk connection during both transmission mode and reception mode of the transmit receive radio frequency switch.

11. The transmit receive radio frequency switch according to claim 1, wherein the at least two other reception transistors are configured to maintain the bulk-to-ground connection during both a transmission mode and a reception mode of the transmit receive radio frequency switch.

12. The transmit receive radio frequency switch according to claim 1, wherein the plurality of reception transistors are serially coupled to each other.

13. The transmit receive radio frequency switch according to claim 3, wherein one of the second resistors is grounded by a secondary coil of a power amplifier output transformer.

14. The transmit receive radio frequency switch according to claim 3, wherein the second resistors have a resistance that ranges between 10 KΩ to 100 KΩ.

15. A method for operating a transmit receive radio frequency switch, the method comprising:
operating the transmit receive radio frequency switch at a reception mode by activating a plurality of reception transistors of a reception path of the transmit receive radio frequency switch, the reception path also comprises an antenna port and a reception output port; the plurality of reception transistors comprise (a) a first reception transistor having a source-bulk connection, and (b) at least two other reception transistors, wherein all reception transistors other than the first reception transistor have a bulk-to-ground connection when the first reception transistor has the source-bulk connection, wherein the first reception transistor is closer to the antenna port than the at least two other reception transistors; and operating the transmit receive radio frequency switch at a transmission mode by activating a plurality of transmission transistors of a transmission path of the transmit receive radio frequency switch, the transmission path also comprises the antenna port and a transmission input port; wherein each transmission transistor of the plurality of transmission transistors has a source-bulk connection, wherein a configuration of the plurality of reception transistors is different than a configuration of the plurality of transmission transistors.

16. The method according to claim 15, wherein the transmission path consists the transmission transistors, the antenna port and the transmission input port; and wherein all transmission transistors have the source-bulk connections.

17. The method according to claim 15, wherein all transmission transistors are serially coupled to each other, and all reception transistors are serially coupled to each other.

18. The transmit receive radio frequency switch according to claim 1, wherein the plurality of reception transistors are serially coupled to each other.

19. The method according to claim 15, wherein the transmission transistors are configured to be in a triode region while the reception transistors are in a cut-off region, and wherein the reception transistors are configured to be in the triode region while the transmission transistors are in the cut-off region.

* * * * *